United States Patent [19]

Ibuchi

[11] Patent Number: 4,980,722

[45] Date of Patent: Dec. 25, 1990

[54] APPARATUS FOR TRANSPORTING A PHOTOSENSITIVE SHEET AT DIFFERENT SPEEDS IN ACCORDANCE WITH THE OPERATION BEING PERFORMED BY THE MACHINE

[75] Inventor: Yoshiaki Ibuchi, Nara, Japan

[73] Assignee: Sharp Kabushiki Kaisha, Osaka, Japan

[21] Appl. No.: 403,749

[22] Filed: Sep. 5, 1989

[30] Foreign Application Priority Data

Sep. 5, 1988 [JP] Japan ................................ 63-221547

[51] Int. Cl.⁵ ............................................. G03G 5/00
[52] U.S. Cl. .................................................... 355/212
[58] Field of Search .................. 355/212, 217, 211, 27

[56] References Cited

U.S. PATENT DOCUMENTS

| | | | |
|---|---|---|---|
| 3,945,724 | 3/1976 | Jackson | 355/212 X |
| 3,950,088 | 4/1976 | Jackson et al. | 355/212 X |
| 4,173,407 | 11/1979 | Kuehnle | 355/212 |
| 4,194,832 | 3/1980 | Tabayashi | 355/212 |
| 4,335,955 | 6/1982 | Lopata | 355/212 |
| 4,475,805 | 10/1984 | Omi | 355/212 |
| 4,624,560 | 11/1986 | Beery | 355/27 |
| 4,711,562 | 12/1987 | Pothast et al. | 355/212 |

Primary Examiner—A. T. Grimley
Assistant Examiner—Nestor R. Ramirez
Attorney, Agent, or Firm—Irell & Manella

[57] ABSTRACT

An apparatus for transporting the photosensitive sheet, including a first controller for controlling a buffer roller to move it into a loading position at the time of automatic loading of the photosensitive sheet, and a second controller for controlling the buffer roller at the time of an image-forming process so that the buffer roller moves to and from a starting position, thereby preventing the jamming of the photosensitive sheet and attaining the forming of a distinct image without a blur.

3 Claims, 6 Drawing Sheets

APPARATUS FOR TRANSPORTING A PHOTOSENSITIVE SHEET AT DIFFERENT SPEEDS IN ACCORDANCE WITH THE OPERATION BEING PERFORMED BY THE MACHINE

BACKGROUND OF THE INVENTION

1. Field of the invention:

This invention relates to an apparatus for successively transporting a photosensitive sheet from a roll of the sheet, more particularly to an apparatus for transporting a photosensitive sheet which comprises a buffer roller for controlling the speed of the sheet-transportation, the said apparatus being used in an apparatus for the formation of images utilizing the photosensitive sheet and an image-receiving sheet.

2. Description of the prior art:

Japanese Laid-Open Patent Publication No. 5888739 discloses a method for the formation of images which utilizes a photosensitive sheet coated with pressure-rupturable capsules containing chromogenic materials and light sensitive hardeners, and an imagereceiving sheet coated with developing materials that react with the chromogenic materials to give rise to color images.

An apparatus for the formation of images utilizing such a method usually comprises an apparatus for transporting a photosensitive sheet, in which the sheet is successively drawn out from a roll of the photosensitive sheet, and transported through a light-exposure section and a pressure-transfer section and then wound around a take up rod. The roll of the photosensitive sheet is housed in a cartridge, thereby preventing the sheet from being exposed to stray light. In such an apparatus for the formation of images, the photosensitive sheet is first exposed to light reflected from the original at the above-mentioned light-exposure section. The reflected light selectively illuminates the pressure-rupturable capsules on the photosensitive sheet so that some of the capsules receive the light and become hardened and others do not receive the light and so are left unchanged, resulting in a latent image corresponding to the image of the original. The photosensitive sheet on which the latent image has been formed is then transported to the above-mentioned pressure-transfer section, where it is brought together with the image-receiving sheet and pressure is applied thereto. Thus, the pressure-rupturable capsules that have not been hardened, rupture, and the chromogenic materials contained therein flow out onto the image-receiving sheet. Then, the chromogenic materials react with the developing materials coated on the image-receiving sheet, which gives rise to color in the chromogenic materials, thereby a colored image corresponding to the latent image being formed on the image-receiving sheet.

In the above-mentioned image-forming process of the apparatus for the formation of images, the optimum sheet-transporting speed at which the latent image can be properly formed at the light-exposure section is usually different from that at which the colored image can be properly formed at the pressure-transfer section. In general, the latter is far higher than the former; for example, the optimum sheet-transporting speed at the pressure-transfer section is about ten times as high as that at the light-exposure section. Thus, a conventional apparatus for transporting a photosensitive sheet comprises a buffer roller that can be moved to control the sheet-transporting speed so that the sheet-transporting speed can be appropriately set at the optimum level at each section.

FIG. 5 illustrates the sheet-transportation of a conventional apparatus for transporting a photo-sensitive sheet by a buffer roller. A photosensitive sheet 52 is drawn out from the roll 51 of the sheet, and transported through a transporting roller 53, a guide roller 54, a buffer roller 55, and a pair of pressure rollers 56, and then wound around a take up rod 57. The buffer roller 55 can be moved in either direction of arrow A or B. When the buffer roller 55 moves in the direction of arrow A, the photosensitive sheet 52 is drawn out from the roll 51. The direction of the sheet-transportation changes at the guide roller 54 as shown by the line of dashes and double dots. While the photosensitive sheet 52 is being drawn out, it is exposed to the light reflected from the original at the light-exposure section P1, resulting in a latent image. When the buffer roller 55 is moved in the direction of arrow B, the portion of the photosensitive sheet 52 corresponding to the latent image is transported into a pressure-transfer section p2, where the latent image is developed into a colored image to be transferred onto an image-receiving sheet as described above.

The sheet-transporting speed can be controlled by adjusting the speed of the above-mentioned linear movement of the buffer roller 55. The speed at which the buffer roller 55 moves in the direction of arrow A is set to be half as high as the optimum sheet-transporting speed at the light-exposure section P1. In the same way, the speed at which the buffer roller 55 moves in the direction of arrow B is set to be half as high as the optimum sheet-transporting speed at the pressure-transfer section.

When a new cartridge of a photosensitive sheet is placed within the body of the apparatus for the formation of images, the foremost end of the photosensitive sheet 52 is automatically transported through the transporting roller 53, the light-exposure section P1, the guide roller 54, the buffer roller 55 and the pressure rollers 56, and then wound around the take up rod 57; this is the process of automatic loading of the photosensitive sheet. If the photosensitive sheet 52 does not extend straight between the guide roller 54 and the buffer roller 55 at the time of this automatic loading of the sheet, the apparatus may become jammed with the photosensitive sheet.

Thus, the base position of the buffer roller 55, to and from which it is moved, is so located that the photosensitive sheet 52 extends substantially straight from the light-exposure section P1 through the guide roller 54 to the buffer roller 55 as shown in FIG. 5. Since the buffer roller 55 stays at this base position at the time of the above-mentioned automatic loading of the photosensitive sheet 52, the apparatus can be prevented from being jammed with the sheet.

It is assumed here that the speed at which the buffer roller 55 moves in the direction of arrow A is v1. The buffer roller 55 is moved from the base position in the direction of arrow A at a speed v1 so that the photosensitive sheet 52 may be transported through the light-exposure section P1 at a speed of 2v1, which is the optimum speed to obtain a latent image. At the beginning of this movement, however, since the buffer roller 55 starts from the base position, the portion of the photosensitive sheet 52 between the guide roller 54 and the buffer roller 55 is not transported straight but is turned along the periphery of the guide roller 54 until it comes to the straight course along the direction of arrow A. When this portion comes to the straight course to be transported straight by the buffer roller 55, the sheet-transporting speed at the light-exposure section P1 is the optimum speed 2v1. But when this portion is turning along the guide roller 54, its course is not straight so that the sheet-transporting speed at the light-exposure section P1 is lower than 2v1. In this way, at the beginning of the light-exposure step, the photosensitive sheet is transported at a speed lower than the optimum speed. Thus, the sheet-transporting speed is not stable during the period of the light-exposure step, which prevents a latent image from being properly formed, resulting in a blur in a colored image.

SUMMARY OF THE INVENTION

The apparatus for transporting a photo-sensitive sheet of this invention, which overcomes the above-discussed and numerous other disadvantages and deficiencies of the prior art, is used in an apparatus for the formation of images utilizing the photosensitive sheet and an image-receiving sheet, said apparatus for transporting the sheet being arranged to draw out the photosensitive sheet from a roll of the sheet and transport it through a light-exposure section, a guide roller, a buffer roller which can be moved along a straight transportation course of the photosensitive sheet, and a pressure-transfer section, and then wind it around a take up rod, wherein said apparatus for transporting the photosensitive sheet comprises a first control means for controlling said buffer roller to move it into a loading position at the time of automatic loading of said photosensitive sheet, and a second control means for controlling said buffer roller at the time of an image-forming process so that said buffer roller moves to and from a starting position.

In a preferred embodiment, the loading position is so located that said photosensitive sheet extends straight from said light-exposure section through said guide roller to said buffer roller.

In a preferred embodiment, the starting position is so located that said buffer roller is aligned with said guide roller along the direction perpendicular to said course of said buffer roller.

Thus, the invention described herein makes possible the objectives of (1) providing an apparatus for transporting a photosensitive sheet in which a first control means controls a buffer roller at the time of automatic loading of the photosensitive sheet so that the sheet extends straight from a light-exposure section through a guide roller to the buffer roller, thereby preventing the jamming of the photosensitive sheet; and (2) providing an apparatus for transporting a photosensitive sheet in which a second control means controls the buffer roller at the time of an image-forming process so that the buffer roller starts from the position at which it is aligned with the guide roller along the direction perpendicular to the course of the buffer roller, thereby allowing the photosensitive sheet to be exposed to light at a fixed speed to properly obtain a latent image, resulting in a distinct image without a blur.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 3:
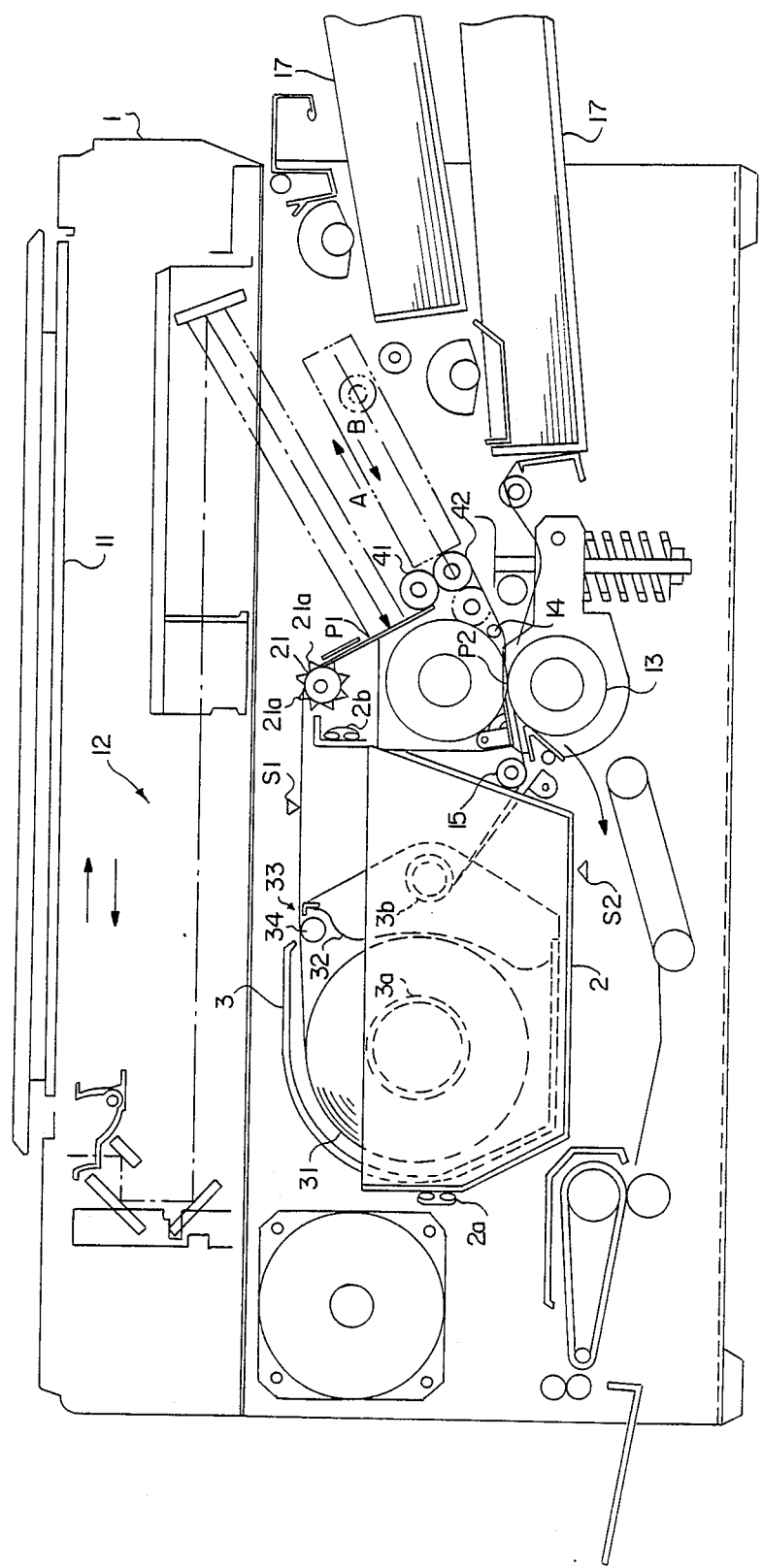
FIG. 3 is a front view in section of a copying apparatus comprising the apparatus for transporting a photosensitive sheet of this invention.

FIG. 3 shows a copying apparatus comprising an apparatus for transporting a photosensitive sheet of this invention.

On the top surface of the body 1 of the copying apparatus is provided a plate 11, on which an original to be copied is placed. An optical system 12 including a light-emitting device, mirrors, lenses, and the like is disposed below the plate 11. The image of the original placed on the plate 11 is scanned by means of the optical system 12, and the light reflected from the original is directed to a light-exposure section P1 to illuminate a photosensitive sheet 31.

A pair of pressure rollers 13, which serve as a pressure-transfer section P2, is disposed in the substantial center of the body 1. The pressure rollers 13 are pressed against each other at a pressure of about 90 kg/cm$^2$ by means of a pressing mechanism including springs, and the like. On the left side of the pressure rollers 13 in FIG. 3, a bucket 2 in the form of a box without a lid is disposed, in which a cartridge 3 of the photosensitive sheet 31 is contained. The bucket 2 can be slid forward with the aid of sliders 2a and 2b until it comes to the position in front of the body 1 as shown in FIG. 4, so that the cartridge 3 in the bucket 2 can be readily replaced with a new one.

Figure 4:
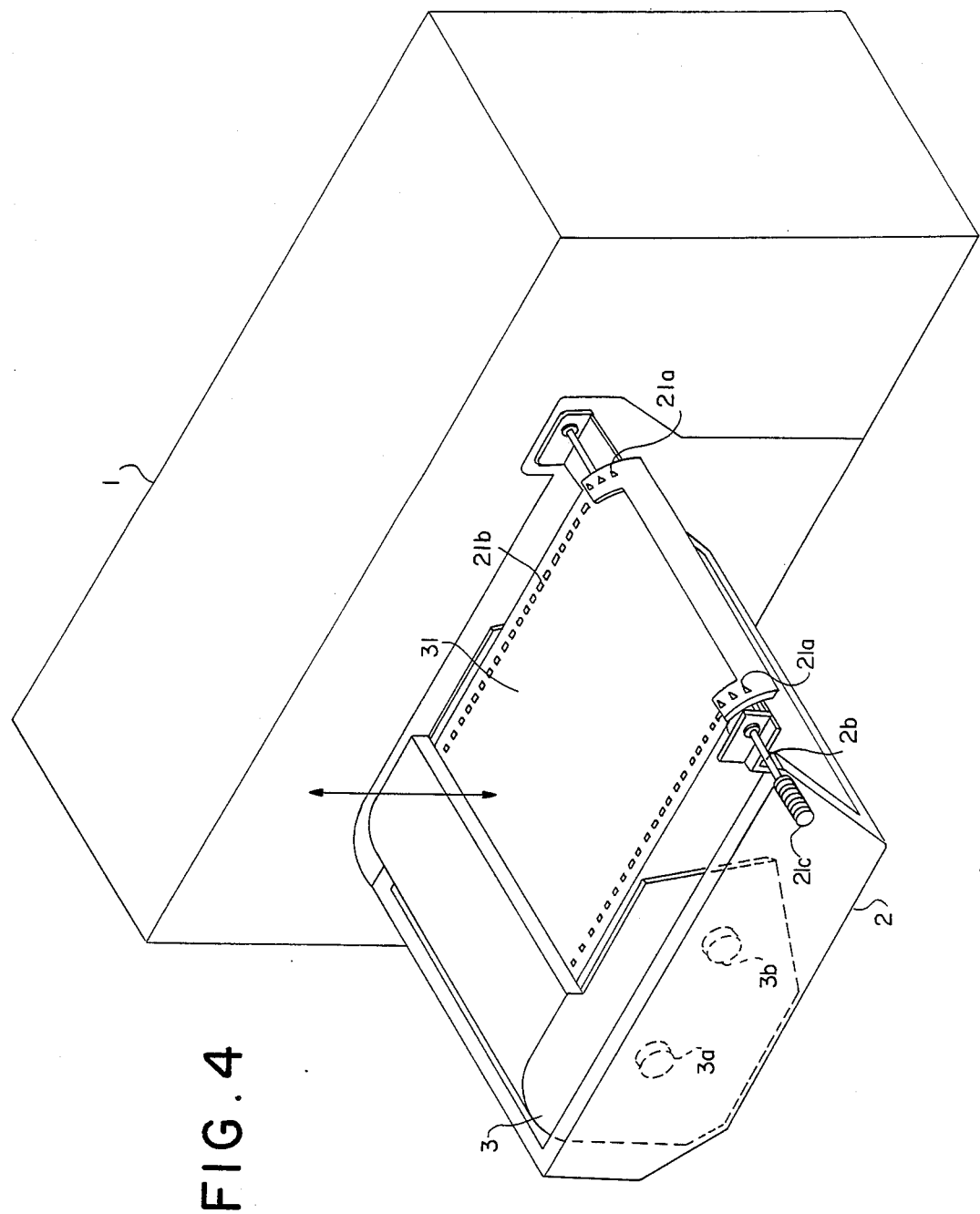
FIG. 4 is a perspective view of a bucket containing a cartridge of the photosensitive sheet of the apparatus of the invention when the bucket is drawn forward into the position in front of the body of the copying apparatus shown in FIG. 3.
Figure 5:
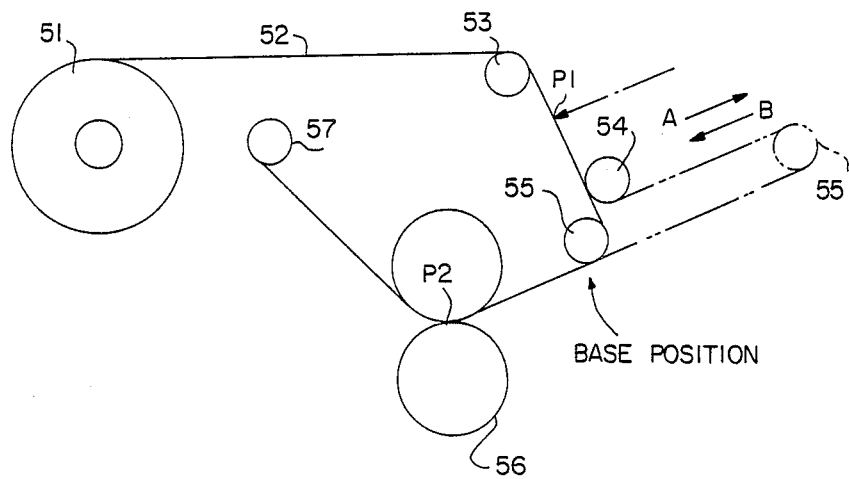
FIG. 5 is a diagram for illustrating the sheet-transportation of a conventional apparatus for transporting a photosensitive sheet.

Referring to FIG. 4, the cartridge 3 which is placed within the bucket 2 comprises a sheet-feeding rod 3a and a take up rod 3b. A photosensitive sheet 31, one side of which is coated with pressure-rupturable capsules including chromogenic materials and light sensitive hardeners, is previously wound around the sheet-feeding rod 3a with its capsule-coated side out, constituting a roll of the sheet. As shown in FIG. 3, the roll of the photosensitive sheet 31 is protected from stray light by means of the frame of the cartridge 3 and a light-blocking sheet 32. Between the upper ends of the frame and the light-blocking sheet 32, the cartridge 3 is provided with an opening 33, through which the photosensitive sheet 31 is drawn out. A roller 34 is disposed at the opening 33. In a new cartridge, the free end of the photosensitive sheet 31 is securely engaged with the roller 34. When the cartridge 3 is to be replaced with a new one, the bucket 2 is first drawn forward into the position in front of the body 1, and then the used cartridge 3 is taken out upward so that a new cartridge can be placed within the bucket 2. The bucket 2 is also provided with a lock mechanism including a solenoid and the like, by which the sheet-feeding rod 3a is locked so that the photosensitive sheet 31 cannot be drawn out when the feeding of the photo-sensitive sheet 31 is not required.

On the upper right side of the bucket 2, a sprocket 21 is disposed. Two guides 21a, each of which consists of a plurality of projections, are respectively formed around each end of the sprocket 21. As shown in FIG. 4, the photosensitive sheet 31 is provided with holes 21b arranged in a row along each side thereof. These holes 21b are sequentially engaged with the guides 21a of the sprocket 21 so that the photo-sensitive sheet 31 is drawn out from the cartridge 3 by the rotation of the sprocket 21. When a new cartridge 3 is to be placed within the bucket 2, the photosensitive sheet 31, the free end of which is securely engaged with the roller 34, is manually drawn out so that the foremost holes 21b thereof are engaged with the guides 21a of the sprocket 21. This work can readily be done by the user since the bucket 2 has been drawn forward into the position in front of the body 1.

After the photosensitive sheet 31 is manually drawn out and engaged with the sprocket 21 as described above, the bucket 2 is pushed back to be placed within the body 1 again. Then, as can be seen in FIG. 3, automatic loading of the photosensitive sheet 31 is carried out; that is, the photosensitive sheet 31 is automatically transported from the sprocket 21 through the light-exposure section P1, a guide roller 41, the buffer roller 42, a transporting roller 14, the pressure-transfer section P2, and then wound around the take up rod 3b.

A rotation gear (not shown) is mounted to the sprocket 21 at the rear side thereof in FIG. 3. The body 1 is also provided with a gear connected to a driving system via a clutch. When the bucket 2 is pushed back into the body 1, the rotation gear attached to the sprocket 21 is engaged with the gear attached to the body 1. Thus, when the gear attached to the body 1 is driven with its clutch engaged, the driving force is transmitted through the rotation gear to the sprocket 21, which then rotates to draw out the photosensitive sheet 31 for the above-mentioned automatic loading of the sheet. As shown in FIG. 4, a knob 21c protrudes from the sprocket 21 toward the front side of the body 1. The guides 21a of the sprocket 21 can be manually adjusted by the knob 21c when the cartridge 3 is replaced with a new one, or when the copying apparatus becomes jammed with the photosensitive sheet 31.

Referring to FIG. 3, the body 1 also includes sensors S1 and S2 therein. The sensor S1 is disposed above the bucket 2 so that it faces the photosensitive sheet 31 to detect the presence of the photosensitive sheet 31. The sensor S2 is disposed below the bucket 2 so that it detects the presence of the bucket 2. The sensor S1 is ON when the photo-sensitive sheet 31 engaged with the sprocket 21 is within the body 1 and it is OFF when the photosensitive sheet 31 is not within the body 1 or when it is not engaged with the sprocket 21 The sensor S2 is ON when the bucket 2 is within the body 1 and it is OFF when the bucket 2 is not placed within the body 1.

The buffer roller 42 is connected to a buffer motor via a clutch. The shaft of the buffer motor can rotate either clockwise or counterclockwise, so that the buffer roller 42 can move in the direction of arrow A or B. The pair of pressure rollers 13 are also connected to a driving system (not shown) via a clutch so that it rotates at a pressure-transfer step. The portion of the photosensitive sheet 31 on which a latent image has been formed is temporarily located in a buffer section shown by a line of dash and double dots in FIG. 3.

An image-forming process in the copying apparatus will now be described, particularly with regard to the formation of latent and colored images. The image-forming process comprises a light-exposure step and a pressure-transfer step. In the light-exposure step, the photosensitive sheet 31 is drawn out and transported through the light-exposure section P1, where it is exposed to light reflected from the original as described above. The reflected light selectively illuminates the pressure-rupturable capsules coated on the photosensitive sheet 31 so that some of the capsules receive the light become hardened, and other capsules do not receive the light and are left unchanged, resulting in a latent image corresponding to the original. Then, in the pressure-transfer step, the portion of the photosensitive sheet 31 on which the latent image has been formed is transported into the pressure-transfer section P2, where at the same time an image-receiving sheet that is coated with developing materials is also supplied from one of paper cassettes 17, which are attached at the right side of the body 1 in FIG. 3. The photosensitive sheet 1 is brought together with the image-receiving sheet and they are pressed against each other by the pressure rollers 13, so that the pressure-rupturable capsules that have not been hardened rupture, whereby the chromogenic materials contained in those capsules flow out onto the image-receiving sheet. The chromogenic materials then react with the developing materials coated on the image-receiving sheet, which gives rise to color in the chromogenic materials. As a result, a colored image corresponding to the latent image is formed on the image-receiving sheet.

A sheet-transporting operation of the apparatus of this invention will be described with reference to FIGS. 1A to 1C.

Figure 1A:
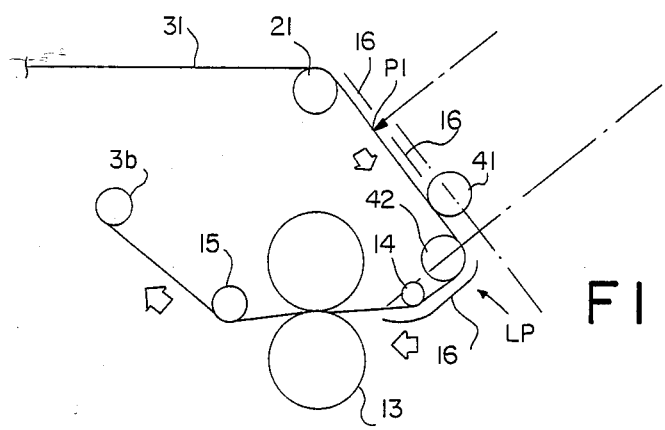
FIG. 1A is a diagram for illustrating the function of a buffer roller at the time of automatic loading of an apparatus for transporting a photo-sensitive sheet of this invention.

FIG. 1A shows the sheet-transporting operation at the time of the automatic loading of the photosensitive sheet 31. As described above, when a new cartridge 3 is to be placed within the bucket 2, the foremost portion of the photosensitive sheet 31 is manually drawn out to be engaged with the sprocket 21. Thus, the photosensitive sheet 31 is transported from the sprocket 21 at the time of the automatic loading.

After the bucket 2 containing the new cartridge 3 is pushed back into the body 1, a first control means moves the buffer roller 42 into a "loading position" (hereinafter referred to as LP). When the buffer roller 42 is located at LP, the photosensitive sheet 31 can be transported substantially straight from the sprocket 21, through the light-exposure section P1 and the guide roller 41, to the buffer roller 42. This prevents the apparatus of the invention from being jammed with the photosensitive sheet at the time of the automatic loading. A LP sensor which detects the presence of the buffer roller 42 is disposed at LP. The LP sensor is ON when the buffer roller 42 is at LP and it is OFF when the buffer roller 42 is not at LP.

After the buffer roller 42 comes into LP, a sheet-transporting system including the sprocket 21, the pressure rollers 13, and the like are driven so that the photosensitive sheet 31 is transported from the sprocket 21 through the guide roller 41, the buffer roller 42, the pressure rollers 13, and a transporting roller 14, and wound around the take up rod 3b, thereby completing the automatic loading of the photosensitive sheet 31. A predetermined length of the foremost portion of the photosensitive sheet 31 is made of a tough resin so that it can be smoothly transported. Paper guides 16 are arranged along the sheet-transportation course in such a manner that the photo-sensitive sheet 31 may not be off course while being transported.

Figure 1B:
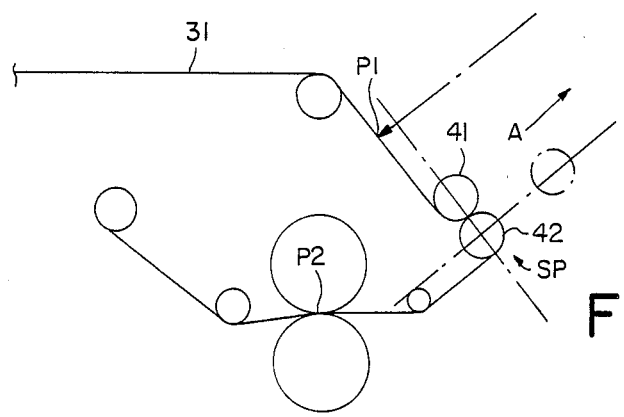
FIGS. 1B and 1C are diagrams for illustrating the function of the buffer roller at the time of an image-forming process of the apparatus of this invention.
Figure 1C:
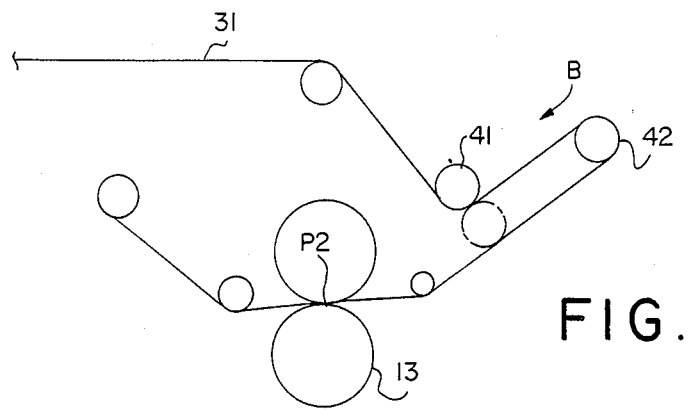

FIGS. 1B and 1C show the sheet-transporting operation at the time of the image-forming process.

During the period of the image-forming process, the buffer roller 42 is controlled by a second control means. As shown in FIG. 1B, before the image-forming process starts, the buffer roller 42 is first moved in the direction of arrow A until it is aligned with the guide roller 41 along the direction perpendicular to that of arrow A. This is the starting position (hereinafter referred to as SP) of the buffer roller 42 in the image-forming process. The buffer roller 42 is moved from SP in the direction of arrow A in the light-exposure step of the image-forming process and is moved back in the direction of arrow B to SP in the pressure-transfer step of the image-forming process. A SP sensor which detects the presence of the buffer roller 42 is located at SP so as to ensure that the buffer roller 42 moves to and from SP as its base position. The SP sensor is ON when the buffer roller 42 is a SP and it is OFF when the buffer roller 42 is not at SP.

In the light-exposure step, the buffer motor rotates to move the buffer roller 42 from SP in the direction of arrow A so that an appropriate length of the photosensitive sheet 31 is drawn out from the cartridge 3 and passed through the light-exposure section P1. While the photosensitive sheet 31 is passing though the light-exposure section P1, it is illuminated by the light reflected from the original, resulting in a latent image as described above. Since the buffer roller 42 starts from SP, the photosensitive sheet 31 is transported straight through the light-exposure section P1 during the entire period of the light-exposure step. Thus, the sheet-transportation speed is stable during the light-exposure step, which allows the latent image to be formed properly, preventing a colored image from being blurred.

After the latent image is formed, the photo-sensitive sheet 31 is further transported by the buffer roller 42 in the direction of arrow A to a predetermined length; the predetermined length is slightly greater than the length of the portion of the photosensitive sheet 31 between the light-exposure section P1 and the pressure-transfer section P2 at the time when the buffer roller 42 is at SP, as shown in FIG. 1B. This ensures that the entire portion of the photosensitive sheet 31 on which the latent image is formed will be transported through the pressure-transfer section P2 in the pressure-transfer step as described below. In the light-exposure step, the pressure rollers 13 do not rotate.

Thereafter, the sheet-feeding rod 3a of the cartridge 3 is locked so that the photosensitive sheet 31 cannot be drawn out any more from the cartridge 3. The pressure-transfer step then starts. The pressure rollers 13 rotate with their clutch engaged to draw the photosensitive sheet 31 from the buffer section, and accordingly the buffer roller 42 moves in the direction of arrow B with the movement of the sheet as shown in FIG. 1C. In this way, the portion of the photosensitive sheet 31 on which the latent image is formed is transported into the pressure-transfer section P2, where at the same time the image-receiving sheet is also supplied. The photosensitive sheet 31 is brought together with the image-receiving sheet and pressure is applied thereto, resulting in a colored image formed on the image-receiving sheet. As described above, after the formation of the latent image, the buffer roller 42 further moves in the direction of arrow A, allowing the photosensitive sheet 31 being further drawn out by the above-mentioned predetermined length. Thus, when the buffer roller 42 is moved in the direction of arrow B back to SP, the portion of the photosensitive sheet 31 corresponding to the latent image completely passes through the pressure rollers 13, thereby the back end of the latent image being slightly ahead of the pressure rollers 13 in the sheet-transporting direction. In this way, the entire portion of the latent image is developed to be transferred onto the image-receiving sheet.

Figure 2A:
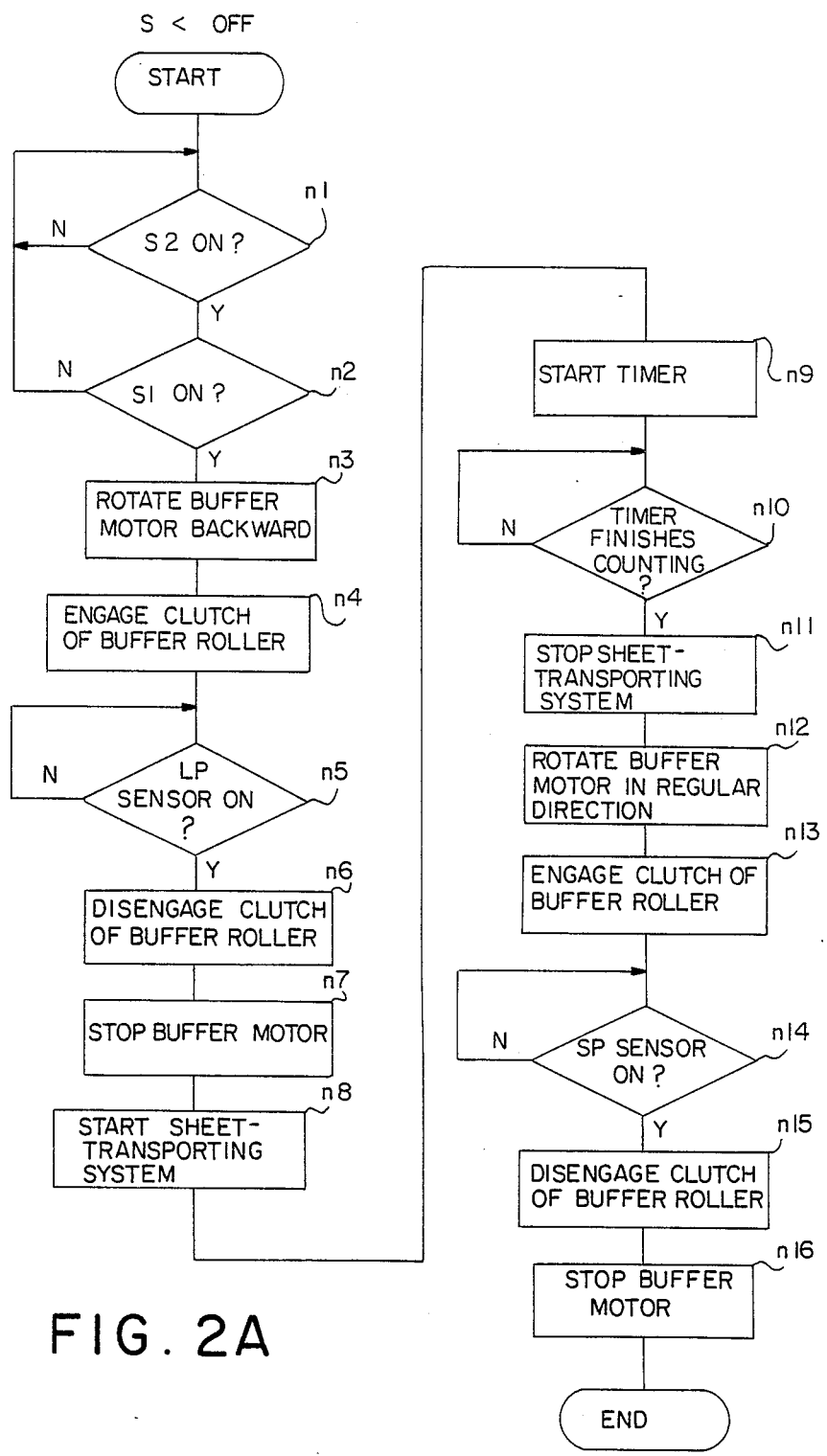
FIG. 2A is a flow-chart showing a procedure of the automatic loading of the photosensitive sheet in the apparatus of this invention.

FIG. 2A is a flow-chart showing the procedure of the automatic loading of the photo-sensitive sheet in the apparatus of the invention During the automatic loading procedure, the buffer roller 42 is controlled by the first control means.

When the bucket 2 is drawn forward into the position in front of the body 1 of the copying apparatus for the replacement of the cartridge 3, the sensor S2 is OFF as described above, and the procedure shown in FIG. 2A starts. When the replacement of the cartridge 3 is completed, the bucket 2 is pushed back into the body 1 so that the sensor S2 is ON in step n1, and that the sensor S1 is ON in step n2. The former indicates that the bucket 2 containing the cartridge 3 is placed within the body 1, and the latter indicates that the the foremost portion of the photosensitive sheet 31 has been drawn out from the cartridge 3 and is engaged with the sprocket 21.

Then, the buffer motor is rotated backward and the clutch of the buffer roller 42 is engaged, so that the buffer roller 42 is moved from SP, at which it usually stays, in the direction of arrow B so as to come into LP (steps n3 and n4). When the buffer roller 42 comes into LP, the LP sensor is ON in step n5, so that the clutch of the buffer roller 42 is disengaged in step n6 and the rotation of the buffer motor is suspended in step n7, allowing the buffer roller 42 to stop at LP. In this way, the light-exposure section P1, the guide roller 41, and the buffer roller 42 are so arranged that the the photosensitive sheet 31 which is transported through them extends straight as shown in FIG. 1A, which prevents the apparatus of this invention from being jammed with the photosensitive sheet 31 at the time of the automatic loading.

When the buffer roller 42 stops at LP, the sheet-transporting system is driven in step n8 and at the same time a timer is started in step n9. The timer counts the time required for the free end of the photosensitive sheet 31 to be transported from the sprocket 21 to the take up rod 3b. When the sheet-transporting system is driven, the photosensitive sheet 31 is transported by the rotation of the sprocket 21, the pressure rollers 13 and the like, so that the automatic loading of the photosensitive sheet 31 starts. When the timer finishes counting in step n10, the loading of the photosensitive sheet 31 is completed. Then, the photosensitive sheet-transporting system stops by the suspension of the rotation of the sprocket 21, the pressure rollers 13, and the like, in step n11, so that the transportation of the photo-sensitive sheet 31 stops.

Then, the buffer motor is rotated in its regular direction in step n12 and the clutch of the buffer roller 42 is engaged in step n13, so that the buffer roller 42 moves in the direction of arrow A to come into SP, and accordingly the SP sensor is ON in step n14. Then, the clutch of the buffer roller 42 is disengaged in step n15 and the buffer motor is suspended in step n16, so as to stop the buffer roller 42 at SP.

Figure 2B:
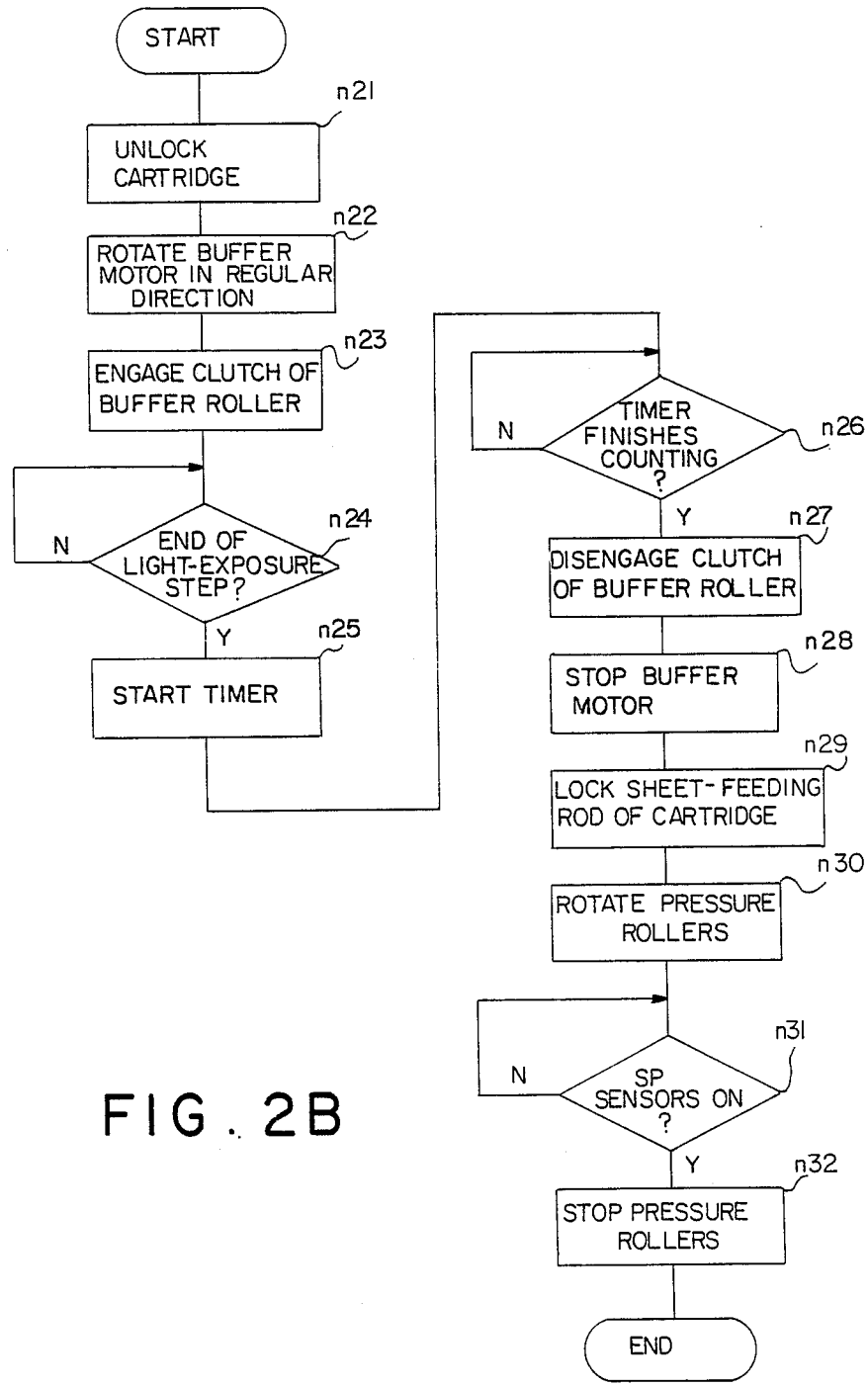
FIG. 2B is a flow-chart showing a photo-sensitive sheet-transporting procedure in the imagesensitive process with use of the apparatus of this invention.

FIG. 2B is a flow-chart showing the photo-sensitive sheet-transporting procedure in the image-forming process for use of the apparatus of this invention. In this procedure, the buffer roller 42 is controlled by the second control means.

When an operation switch attached to the body 1 of the copying apparatus is pressed, the photosensitive sheet-transporting procedure for the image-forming process starts. At the beginning of the procedure, the sheet-feeding rod 3a of the cartridge 3 is unlocked in step n21 so that the photosensitive sheet 31 may be drawn out. Then, the buffer motor is rotated in its regular direction in step n22 and the clutch of the buffer roller 42 is engaged in step n23 so that the buffer roller 42 moves in the direction of arrow A to draw out the photosensitive sheet 31 from the cartridge 3. While the photosensitive sheet 31 is being drawn, the original placed on the plate 11 is scanned by light from the optical system 12 and the light reflected from the original is directed to the light-exposure section P1, where the photosensitive sheet 31 is exposed to the reflected light, resulting in a latent image corresponding to the original. When the light-exposure step is completed in step n24, a timer starts in step n25. The timer counts the time required for a predetermined length of photosensitive sheet 31 to be further drawn out by the buffer roller 42; the predetermined length is slightly greater than the length of the portion of the photosensitive sheet 31 between the light-exposure section P1 and the pressure-transfer section P2 at the time when the buffer roller 42 is at SP, as described above. When the timer finishes counting in step n26, the clutch of the buffer roller 42 is disengaged in step n27 and the buffer motor is turned off in step n28, and at the same time, the sheet-feeding rod 3a of the cartridge 3 is locked in step n29, so that the photosensitive sheet 31 cannot be drawn out any more from the cartridge 3.

Thereafter, the pressure rollers 13 are rotated with its clutch engaged in step n30, so as to draw the photosensitive sheet 31 from the buffer section, allowing the buffer roller 42 also to be drawn in the direction of arrow B. While the photosensitive sheet 31 is being drawn in this direction, the portion of the photosensitive sheet 31 corresponding to the latent image is transported through the pressure rollers 13, where the image-receiving sheet is supplied and these two sheets are pressed against each other, resulting in a colored image formed on the imagereceiving sheet as described above. When the buffer roller 42 comes into SP in step n31, the clutch of the buffer roller 42 is disengaged so that the rotation thereof is suspended in step n32. At the end of the procedure, the back end of the latent image on the photosensitive sheet 31 is located slightly ahead of the pressure rollers 13 in the sheet-transporting direction, since the photosensitive sheet 31 was further drawn out by the predetermined length after the light-exposure step as described above.

Although the SP of the buffer roller is so located that the buffer roller is aligned with the guide roller 41 along the direction perpendicular to that of arrow A, as shown in FIG. 1B in this example, it can of course be located slightly away from the position of this SP in the direction of arrow A. Also in this case, the photosensitive sheet 31 can be drawn out at a fixed speed that is twice as high as that of the buffer roller during the entire period of the light-exposure step. This allows a latent image to be properly formed, resulting in a colored image without a blur.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In an apparatus for transporting a photosensitive sheet, which is used in an apparatus for the formation of images utilizing the photosensitive sheet and an image-receiving sheet, said apparatus for transporting the sheet being arranged to draw out the photosensitive sheet from a roll of the sheet and transport it through a light-exposure section; a guide roller, a buffer roller movable in a direction substantially perpendicular to the course in which the photosensitive sheet is transported through said light exposure section, and a pressure-transfer section, and then wind it around a take up rod, wherein said apparatus for transporting the photosensitive sheet further comprises:

a first control means for controlling said buffer roller to move it into a loading position at the time of automatic loading of said photosensitive sheet, and a second control means for controlling said buffer roller at the time of an image-forming process so that said buffer roller moves to and from a starting position.

2. An apparatus according to claim 1, wherein said loading position is so located that said photosensitive sheet extends straight from said light-exposure section through said guide roller to said buffer roller.

3. An apparatus according to claim 1, wherein said starting position is so located that said buffer roller is aligned with said guide roller along the direction perpendicular to said course of said buffer roller.

* * * * *